United States Patent

Stockham, Jr. et al.

[11] Patent Number: 5,848,171
[45] Date of Patent: *Dec. 8, 1998

[54] HEARING AID DEVICE INCORPORATING SIGNAL PROCESSING TECHNIQUES

[75] Inventors: Thomas G. Stockham, Jr., Salt Lake City; Douglas M. Chabries, Woodland Hills, both of Utah

[73] Assignee: Sonix Technologies, Inc., Salt Lake City, Utah

[*] Notice: The term of this patent shall not extend beyond the expiration date of Pat. No. 5,500,902.

[21] Appl. No.: 585,481

[22] Filed: Jan. 16, 1996

Related U.S. Application Data

[63] Continuation of Ser. No. 272,927, Jul. 8, 1994, Pat. No. 5,500,902.

[51] Int. Cl.$^6$ .................................................. H04R 25/00
[52] U.S. Cl. .......................... 381/321; 381/320; 381/106
[58] Field of Search .......................... 381/68, 68.2, 68.4, 381/102, 106, 312, 320, 321; 455/232.1, 234.1, 234.2, 235.1, 247.1, 251.1, 303, 306

[56] References Cited

U.S. PATENT DOCUMENTS

| | | | |
|---|---|---|---|
| 3,495,244 | 2/1970 | Rosa | 343/17.1 |
| 3,518,578 | 6/1970 | Oppenheim et al. | 333/14 |
| 3,784,750 | 1/1974 | Stearns et al. | 179/1 |
| 3,920,931 | 11/1975 | Yanick, Jr. | 179/107 |
| 3,927,279 | 12/1975 | Nakamura et al. | 179/107 |
| 3,989,904 | 11/1976 | Rohrer et al. | 179/107 |
| 4,025,721 | 5/1977 | Graupe et al. | 179/1 |
| 4,025,723 | 5/1977 | Blackledge | 179/1 |
| 4,051,331 | 9/1977 | Strong et al. | 179/107 |
| 4,052,571 | 10/1977 | Gregory et al. | 179/107 |
| 4,052,572 | 10/1977 | Schafer | 179/107 |
| 4,099,035 | 7/1978 | Yanick | 179/107 |
| 4,118,604 | 10/1978 | Yanick | 179/107 |
| 4,135,590 | 1/1979 | Gaulder | 179/1 |
| 4,142,072 | 2/1979 | Berland | 179/107 |
| 4,185,168 | 1/1980 | Graupe et al. | 179/1 |
| 4,187,413 | 2/1980 | Moser | 179/107 |
| 4,188,667 | 2/1980 | Graupe et al. | 364/724 |
| 4,238,746 | 12/1980 | McCool et al. | 333/166 |

(List continued on next page.)

FOREIGN PATENT DOCUMENTS

| | | | |
|---|---|---|---|
| 0 064 042 | 1/1986 | European Pat. Off. | H04R 25/00 |
| 0 415 677 | 3/1991 | European Pat. Off. | H04R 25/00 |
| 0 581 261 | 2/1994 | European Pat. Off. | H04R 25/00 |
| 0 581 262 | 2/1994 | European Pat. Off. | H04R 3/00 |
| 26 28 626 | 1/1977 | Germany | H03G 7/06 |

OTHER PUBLICATIONS

Berlin et al., "Hearing Science: Recent Advances", College Hill Press, Inc., 1985, pp. 241–262.

Buus et al., "Psychometric Functions for Level Discrimination", J. Acoustic Soc. Am., 90 (3), Sep. 1991, pp. 1371–1380.

Carney, L.H., "A Model for the Responses of Low–Frequency Auditory–Nerve Fibers in Cat", J. Acout. Soc. Am., 93(1), Jan. 1993, pp. 401–417.

Drake et al., "Wavelet Analysis in Recruitment of Loudness Compensation", IEEE Transactions on Signal Processing, vol. 41, No. 12, Dec. 1993, pp. 3306–3311.

(List continued on next page.)

*Primary Examiner*—Huyen Le
*Attorney, Agent, or Firm*—D'Alessandro & Ritchie

[57] ABSTRACT

A hearing compensation system for the hearing impaired comprises an input transducer for converting acoustical information at an input to electrical signals at an output, an output transducer for converting electrical signals at an input to acoustical information at an output, a plurality of bandpass filters, each bandpass filter having an input connected to the output of said input transducer, a plurality of AGC circuits, each individual AGC circuit associated with a different one of the bandpass filters and having an input connected to the output of its associated bandpass filter and an output connected to the input of the output transducer.

37 Claims, 5 Drawing Sheets

U.S. PATENT DOCUMENTS

| | | | |
|---|---|---|---|
| 4,243,935 | 1/1981 | McCool et al. | 324/77 |
| 4,354,065 | 10/1982 | Buettner | 179/107 |
| 4,355,368 | 10/1982 | Zeidler et al. | 364/728 |
| 4,366,349 | 12/1982 | Adelman | 179/107 |
| 4,396,806 | 8/1983 | Anderson | 179/107 |
| 4,405,831 | 9/1983 | Michelson | 179/1 |
| 4,405,832 | 9/1983 | Sondermeyer | 179/1 |
| 4,419,544 | 12/1983 | Adelman | 179/107 |
| 4,425,481 | 1/1984 | Mansgold et al. | 179/107 |
| 4,471,171 | 9/1984 | Köpke et al. | 179/107 |
| 4,508,940 | 4/1985 | Steeger | 179/107 |
| 4,545,082 | 10/1985 | Hood | 623/1 |
| 4,548,082 | 10/1985 | Engebretson et al. | 73/585 |
| 4,602,337 | 7/1986 | Cox | 364/480 |
| 4,622,440 | 11/1986 | Slavin | 381/68.1 |
| 4,658,426 | 4/1987 | Chabries et al. | 381/94 |
| 4,696,032 | 9/1987 | Levy | 379/390 |
| 4,712,244 | 12/1987 | Zwicker et al. | 381/68.1 |
| 4,723,294 | 2/1988 | Taguchi | 381/94 |
| 4,731,850 | 3/1988 | Levitt et al. | 381/68.2 |
| 4,759,071 | 7/1988 | Heide | 381/68.4 |
| 4,768,165 | 8/1988 | Hohn | 364/900 |
| 4,773,095 | 9/1988 | Zwicker et al. | 381/68.1 |
| 4,827,524 | 5/1989 | Rising | 381/60 |
| 4,852,175 | 7/1989 | Kates | 381/68.4 |
| 4,852,177 | 7/1989 | Ambrose | 381/154 |
| 4,870,688 | 9/1989 | Voroba et al. | 381/60 |
| 4,879,749 | 11/1989 | Levitt et al. | 381/68.4 |
| 4,882,762 | 11/1989 | Waldhauer | 381/106 |
| 4,887,299 | 12/1989 | Cummins et al. | 381/68.4 |
| 4,912,767 | 3/1990 | Chang | 381/47 |
| 4,926,488 | 5/1990 | Nadas et al. | 381/41 |
| 4,939,685 | 7/1990 | Feintuch | 364/724.19 |
| 4,947,433 | 8/1990 | Gebert | 381/69 |
| 4,953,216 | 8/1990 | Beer | 381/68.4 |
| 4,956,867 | 9/1990 | Zurek et al. | 381/94.1 |
| 4,961,230 | 10/1990 | Rising | 381/69.2 |
| 4,982,317 | 1/1991 | Mauthe | 363/60 |
| 4,988,333 | 1/1991 | Engebretson et al. | 600/25 |
| 4,989,251 | 1/1991 | Mangold | 381/68.2 |
| 4,992,966 | 2/1991 | Widin et al. | 364/571.04 |
| 5,014,318 | 5/1991 | Schott et al. | 381/47 |
| 5,016,280 | 5/1991 | Engebretson et al. | 381/68 |
| 5,024,224 | 6/1991 | Engebretson et al. | 128/420.6 |
| 5,027,410 | 6/1991 | Williamson et al. | 381/68.4 |
| 5,029,217 | 7/1991 | Chabries et al. | 381/68.2 |
| 5,033,090 | 7/1991 | Weinrich | 381/68.4 |
| 5,046,102 | 9/1991 | Zwicker et al. | 381/68.2 |
| 5,046,103 | 9/1991 | Warnaka et al. | 381/71 |
| 5,083,312 | 1/1992 | Newton et al. | 381/68.4 |
| 5,091,952 | 2/1992 | Williamson et al. | 381/68.2 |
| 5,144,674 | 9/1992 | Meyer et al. | 381/68 |
| 5,189,704 | 2/1993 | Krauss | 381/68.4 |
| 5,201,006 | 4/1993 | Weinrich | 381/68 |
| 5,214,709 | 5/1993 | Ribic | 381/68.1 |
| 5,233,665 | 8/1993 | Vaughn et al. | 381/97 |
| 5,278,912 | 1/1994 | Waldhauer | 381/68.4 |
| 5,289,544 | 2/1994 | Franklin | 381/68.1 |
| 5,291,525 | 3/1994 | Funderburk et al. | 375/98 |
| 5,378,933 | 1/1995 | Pfannenmueller et al. | 327/172 |
| 5,402,496 | 3/1995 | Soli et al. | 381/94 |

OTHER PUBLICATIONS

Geisler et al., "Effects of a Compressive Nonlinearity in a Cochlear Model", J. Acoust. Soc. Am., vol. 78, No. 1, Juky 1985, pp. 257–261.

Graupe, "Applications of Estimation and Identification Theory to Hearing Aids", Auditory and Prosthetic Research, 1979, pp. v–vii, 169–181.

Hellman et al., "Intensity Discrimination as the Driving Force for Loudness: Application to Pure Tones in Quiet", J. Acoust. Soc. Am. 87 (3). Mar. 1990, pp. 1255–1265.

Killion, Mead C., "The K–Amp Hearing Aid: An Attempt to Present High Fidelity for Persons with Impaired Hearing", American Journal of Audiology, vol. 2, No. 2, pp. 52–74, Jul. 1993.

Larson et al., "Auditory & Hearing Prosthetic Research", Grune & Stratton, New York, 1979, pp. v–vii, 169–181.

Lyon, R.F., "An Analog Electronic Cochlea", IEEE Transactions on Acoustics, Speech, and Signal Processing, vol. 36, No. 7, Jul. 1988, pp. 1119–1135.

Neely et al., "A Model for Active Elements in Cochlear Biomechanics", J. Acoust. Soc. Am. 79 (5), May 1986, pp. 1472–1480.

Oppenheim et al., "Nonlinear Filtering of Multiplied and Convolved Signals", Proceedings for the IEEE, vol. 56, Aug. 1968, pp. 1241–1291.

Paul, J.E., "Adaptive Digital Techniques for Audio Noise Cancellation", Proceedings of the 1978 IEEE International Symposium on Circuits and Systems, New York, May 17–19, 1978, pp. 232–236.

Plomp, Renier, "Noise, Amplification, and Compression: Considerations of Three Main Issues in Hearing Aid Design", Ear & Hearing, Feb. 1994, pp. 2–12.

Plomp, Renier, "The Negatice Effect of Amplitude Compression in Multichannel Hearing Aids in the Light of the Modulation–Transfer Function", Journal of the Acoustical Society of America, 83 (6), Jun. 1988, pp. 2322–2327.

Sachs et al., "A Computational Model for Rate–Level Functions from Cat Auditory–Nerve Fibers", Hearing Research, 41 (1989), pp. 61–69.

Siegel, Lee, "Sound Sans Distortion", The Salt Lake Tribune, Science & Medicine, Nov. 4, 1993, pp. B1–B3.

Stein et al., "Listener–Assessed Intelligibility of a Hearing Aid Self–Adaptive Noise Filter", Ear & Hearing, vol. 5, No. 4, 1984, pp. 199–204.

Stockham, Jr., "Image Processing in the Context of a Visual Model", Proceedings of the IEEE, vol. 60, No. 7, Jul. 1972, pp. 828–842.

Stockham, Jr., "The Application of Generalized Linearity to Automatic Gain Control", IEEE Transactions on Audio and Electroacoustics, AU–16(2): pp. 267–271, Jun. 1968.

Ventura, J.C., "Digital Audio Gain Control for Hearing Aids", ICASSP, vol. 3, May 23–24, 1989, pp. 2049–2052.

Ventura, J.C., "Multiband Digital Gain Controller", European Conference on Speech Communication and Technology, Sep. 1989, pp. 582–585.

Weiss et al., "A Model for Signal Transmission in an Ear Having Hair Cells with Free–Standing Stereocillia. I.V. Mechanoelectric Transduction Stage", Hearing Research 20 (1985), pp. 175–195.

Winter et al., "Intensity Coding in Low–Frequency Auditory–Nerve Fibers of the Guinea Pig", J. Acoust. Soc. Am., 90 (4), pt. 1, Oct. 1991, pp. 1958–1967.

Xie et al., "Toward the Unification of Three Visual Law and Two Visual Models in Brightness Perception", IEEE Transactions on Systems, Man and Cybernetics, vol. 19, No. 2, Mar./Apr. 1989, pp. 379–387.

Yates, G. "Basilar Membrane Nonlinearity and Its Influence on Auditory Nerve Rate–Intensity Functions", Hearing Research, 50 (1990), pp. 145–162.

HEARING AID DEVICE INCORPORATING SIGNAL PROCESSING TECHNIQUES

CROSS-REFERENCE TO RELATED APPLICATION

This application is a continuation of patent application Ser. No. 08/272,927, filed Jul. 8, 1994 now U.S. Pat. No. 5,500,902.

BACKGROUND OF THE INVENTION

1. Field of the Invention

The present invention relates to electronic hearing aid devices for use by the hearing impaired and to methods for providing hearing compensation. More particularly, the present invention relates to such devices and methods utilizing both analog and digital signal processing techniques.

2. The Prior Art

One of the most common complaints of hearing aid users is the inability to hear in the presence of noise. As a result, several researchers have opted for acoustic schemes which suppress noise to enhance the intelligibility of sound. Examples of this approach are found in U.S. Pat. Nos. 4,025,721 to Graupe, 4,405,831 to Michaelson, 4,185,168 to Graupe et al., 4,188,667 to Graupe et al., 4,025,721 to Graupe et al., 4,135,590 to Gaulder, and 4,759,071 to Heide et al.

Other approaches have focussed upon feedback suppression and equalization (U.S. Pat. Nos. 4,602,337 to Cox, and 5,016,280 to Engebretson), dual microphone configurations (U.S. Pat. Nos. 4,622,440 to Slavin and 3,927,279 to Nakamura et al.), or upon coupling to the ear in unusual ways (e.g., RF links, electrical stimulation, etc.) to improve intelligibility. Examples of these approaches are found in U.S. Pat. Nos. 4,545,082 to Engebretson, 4,052,572 to Shafer, 4,852,177 to Ambrose, and 4,731,850 to Levitt.

Still other approaches have opted for digital programming control implementations which will accommodate a multitude of compression and filtering schemes. Examples of such approaches are found in U.S. Pat. Nos. 4,471,171 to Kopke et al. and 5,027,410 to Williamson. Some approaches, such as that disclosed in U.S. Pat. No. 5,083,312 to Newton, utilize hearing aid structures which allow flexibility by accepting control signals received remotely by the aid.

U.S. Pat. No. 4,187,413 to Moser discloses an approach for a digital hearing aid which uses an analog-to-digital converter, a digital-to-analog converter, and implements a fixed transfer function H(z). However, a review of neuropsychological models in the literature and numerous measurements resulting in Steven's and Fechner's laws (see S. S. Stevens, *Psychophysics,* Wiley 1975; G. T. Fechner, *Elemente der Psychophysik,* Breitkopf u. Hârtel, Leipzig, 1860) conclusively reveal that the response of the ear to input sound is nonlinear. Hence, no fixed transfer function H(z) exists which will fully compensate for hearing.

U.S. Pat. No. 4,425,481 to Mangold, et. al. discloses a programmable digital signal processing (DSP) device with features similar or identical to those commercially available, but with added digital control in the implementation of a three-band (lowpass, bandpass, and highpass) hearing aid. The outputs of the three frequency bands are each subjected to a digitally-controlled variable attenuator, a limiter, and a final stage of digitally-controlled attenuation before being summed to provide an output. Control of attenuation is apparently accomplished by switching in response to different acoustic environments.

U.S. Pat. Nos. 4,366,349 and 4,419,544 to Adelman describe and trace the processing of the human auditory system, but do not reflect an understanding of the role of the outer hair cells within the ear as a muscle to amplify the incoming sound and provide increased basilar membrane displacement. These references assume that hearing deterioration makes it desirable to shift the frequencies and amplitude of the input stimulus, thereby transferring the location of the auditory response from a degraded portion of the ear to another area within the ear (on the basilar membrane) which has adequate response.

Mead C. Killion, *The k-amp hearing aid: an attempt to present high fidelity for persons with impaired hearing,* American Journal of Audiology, 2(2): pp. 52–74, July 1993, states that based upon the results of subjective listening tests for acoustic data processed with both linear gain and compression, either approach performs equally well. It is argued that the important factor in restoring hearing for individuals with losses is to provide the appropriate gain. Lacking a mathematically modeled analysis of that gain, several compression techniques have been proposed, e.g., U.S. Pat. No. 4,887,299 to Cummins; U.S. Pat. No. 3,920,931 to Yanick, Jr.; U.S. Pat. No. 4,118,604 to Yanick, Jr.; U.S. Pat. No. 4,052,571 to Gregory; U.S. Pat. No. 4,099,035 to Yanick, Jr. and U.S. Pat. No 5,278,912 to Waldhauer. Some involve a linear fixed high gain at soft input sound levels and switch to a lower gain at moderate or loud sound levels. Others propose a linear gain at the soft sound intensities, a changing gain or compression at moderate intensities and a reduced, fixed linear gain at high or loud intensities. Still others propose table look-up systems with no details specified concerning formation of look-up tables, and others allow programmable gain without specification as to the operating parameters.

Switching between the gain mechanisms in each of these sound intensity regions has introduced significant distracting artifacts and distortion in the sound. Further, these gain-switched schemes have been applied typically in hearing aids to sound that is processed in two or three frequency bands, or in a single frequency band with pre-emphasis filtering.

Insight into the difficulty with prior art gain-switched schemes may be obtained by examining the human auditory system. For each frequency band where hearing has deviated from the normal threshold, a different sound compression is required to provide for normal hearing sensation to result. The application of gain schemes which attempt to combine more than a critical band (i.e., resolution band in hearing as defined in Jack Katz (Ed.) *Handbook of Clinical Audiology,* Williams & Wilkins, Baltimore, third ed., 1985) in frequency range cannot produce the appropriate hearing sensation in the listener. If, for example, it is desired to combine two frequency bands then some conditions must be met in order for the combination to correctly compensate for the hearing loss. These conditions for the frequency bands to be combined are that they have the same normal hearing threshold and dynamic range and require the same corrective hearing gain. In general, this does not occur even if a hearing loss is constant in amplitude across several critical bands of hearing. Failure to properly account for the adaptive full-range compression will result in degraded hearing or equivalently, loss of fidelity and intelligibility by the hearing impaired listener. Therefore, prior art which does not provide sufficient numbers of frequency bands to compensate for hearing losses will produce degraded hearing.

Several schemes have been proposed which use multiple bandpass filters followed by compression devices (see U.S.

Pat. Nos. 4,396,806 to Anderson, 3,784,750 to Stearns et al., and 3,989,904 to Rohrer).

One example of prior art in U.S. Pat. No. 5,029,217 to Chabries focussed on an FFT frequency domain version of a human auditory model. The FFT implements an efficiently-calculated frequency domain filter which uses fixed filter bands in place of the critical band equivalents which naturally occur in the ear due to its unique geometry, thereby requiring that the frequency resolution of the FFT be equivalent to the smallest critical band to be compensated. The efficiency of the FFT in large part negated by the fact that many additional filter bands are required in the FFT approach to cover the same frequency spectrum as a different implementation with critical bandwidth filters. This FFT implementation is complex and likely not suitable for low-power battery applications.

The prior-art FFT implementation introduces a block delay into the processing system inherent in the FFT itself. Blocks of samples are gathered for insertion into the FFT. This block delay introduces a time delay into the sound stream which is annoying and can induce stuttering when one tries to speak or can introduce a delay which sounds like an echo when low levels of compensation are required for the hearing impaired individual.

The prior art FFT implementation of a frequency-domain mapping between perceived sound and input sound levels for the normal and hearing impaired is undefined phenomenalogically. In other words, lacking a description of the perceived sound level versus input sound level for both the desired hearing response and the hearing impaired hearing response, these values were left to be measured.

For acoustic input levels below hearing (i.e. soft background sounds which are ever present), the FFT implementation described above provides excessive gain. This results in artifacts which add noise to the output signal. At hearing compensation levels greater than 60 dB, the processed background noise level can become comparable to the desired signal level in intensity thereby introducing distortion and reducing sound intelligibility.

As noted above, the hearing aid literature has proposed numerous solutions to the problem of hearing compensation for the hearing impaired. While the component parts that are required to assemble a high fidelity, full-range, adaptive compression system have been known since 1968, no one has to date proposed the application of the multiplicative AGC to the several bands of hearing to compensate for hearing losses. According to the present invention, this is precisely the operation required to provide near normal hearing perception to the hearing impaired.

BRIEF DESCRIPTION OF THE INVENTION

According to the present invention, a hearing compensation system for the hearing impaired comprises an input transducer for converting acoustical information at an input to electrical signals at an output, an output transducer for converting electrical signals at an input to acoustical information at an output, a plurality of bandpass filters, each bandpass filter having an input connected to the output of said input transducer, a plurality of AGC circuits, each individual AGC circuit associated with a different one of the bandpass filters and having an input connected to the output of its associated bandpass filter and an output connected to the input of the output transducer. A presently preferred embodiment of the invention employs 12–15 ⅓ octave bandpass filters and operates over a bandwidth of between about 200–10,000 Hz. In the presently preferred embodiment, the AGC circuits are multiplicative AGC circuits. The filters are designed as ⅓ octave multiples in bandwidth over the band from 500 Hz to 10,000 Hz, with a single band filter from 0–500 Hz.

BRIEF DESCRIPTION OF THE DRAWING FIGURES

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to the present invention, it has been discovered that the appropriate approach to high fidelity hearing compensation is to separate the input acoustic stimulus into frequency bands with a resolution at least equal to the critical bandwidth, which for a large range of the sound frequency spectrum is less than ⅓ octave, and apply a multiplicative AGC with a fixed exponential gain coefficient for each band. Those of ordinary skill in the art will recognize that the principles of the present invention may be applied to audio applications other than hearing compensation for the hearing impaired. Non-exhaustive examples of other applications of the present invention include music playback for environments with high noise levels, such as automotive environments, voice systems in factory environments, and graphic sound equalizers such as those used in stereophonic sound systems.

As will be appreciated by persons of ordinary skill in the art, the circuit elements of the hearing compensation apparatus of the present invention may be implemented as either an analog circuit or as a digital circuit, preferably a microprocessor or other computing engine performing digital signal processing (DSP) functions to emulate the analog circuit functions of the various components such as filters, amplifiers, etc. It is presently contemplated that the DSP version of the circuit is the preferred embodiment of the invention, but persons of ordinary skill in the art will recognize that an analog implementation, such as might be integrated on a single semiconductor substrate, will also fall within the scope of the invention. Such skilled persons will also realize that in a DSP implementation, the incoming audio signal will have to be time sampled and digitized using conventional analog to digital conversion techniques.

Figure 1:
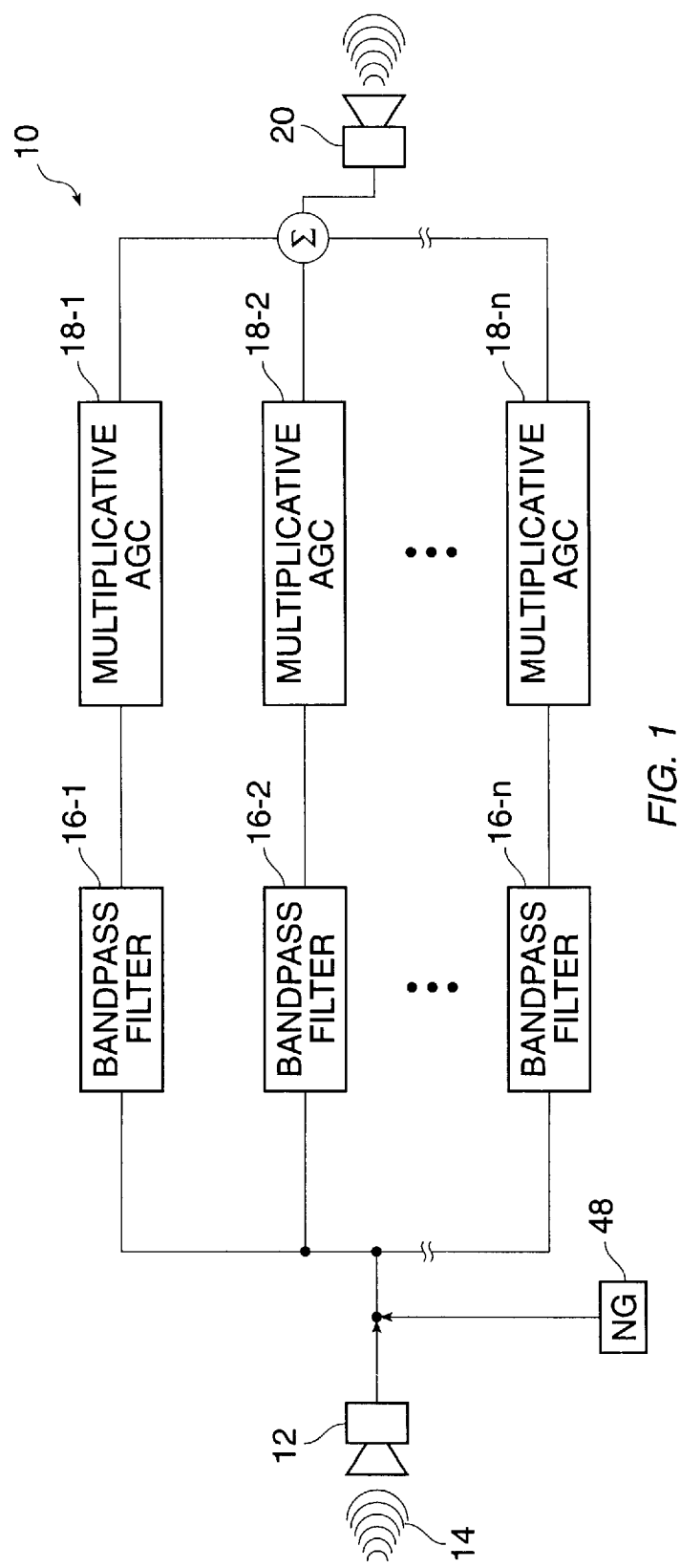
FIG. 1 is a block diagram of a presently preferred hearing compensation system according to the present invention.

Referring first to FIG. 1, a block diagram of a presently preferred hearing compensation system 10 according to the present invention is presented. The hearing compensation system 10 according to a presently preferred embodiment of the invention includes an input transducer 12 for converting acoustical energy (shown schematically at reference numeral 14) into an electrical signal corresponding to that acoustical energy. Various known hearing-aid microphone transducers, such as a model EK 3024, available from Knowles Electronics of Ithaca, Ill., are available for use as input transducer 12, or other microphone devices may be employed.

The heart of hearing compensation system 10 of the present invention comprises a plurality of audio bandpass filters. In FIG. 1, three audio bandpass filters are shown at reference numerals 16-1, 16-2 . . . 16-n to avoid overcomplicating the drawing. According to a presently preferred embodiment of the invention, n will be an integer from 12 to 15, although persons of ordinary skill in the art will understand that the present invention will function if n is a different integer.

Audio bandpass filters 16-1 to 16-n preferably have a bandpass resolution of ⅓ octave or less, but in no case less than about 125 Hz, and have their center frequencies logarithmically spaced over a total audio spectrum of from about 200 Hz to about 10,000 Hz. The audio bandpass filters may have bandwidths broader than ⅓ octave, i.e., up to an octave or so, but with degrading performance. The design of ⅓ octave bandpass filters is well within the level of skill of the ordinary worker in the art. Therefore the details of the circuit design of any particular bandpass filter, whether implemented as an analog filter or as a DSP representation of an analog filter, will be simply a matter of design choice for such skilled persons.

According to a presently preferred embodiment of the invention, bandpass filters 16-1 through 16-n are realized as eighth-order Elliptic filters with about 0.5 dB ripple in the passband and about 70 dB rejection in the stopband. Those of ordinary skill in the art will recognize that several bandpass filter designs including, but not limited to, other Elliptic, Butterworth, Chebyshev, or Bessel filters, may be employed. Further, filter banks designed using wavelets, as disclosed, for example, in R. A. Gopinath Wavelets and Filter Banks-New Results and Applications, PhD Dissertation, Rice University, Houston, Tex., May 1993, may offer some advantage. Any of these bandpass filter designs may be employed without deviating from the concepts of the invention disclosed herein.

Each individual bandpass filter 16-1 to 16-n is cascaded with a corresponding multiplicative automatic gain control (AGC) circuit. Three such devices 18-1, 18-2, and 18-n are shown in FIG. 1. Multiplicative AGC circuits are known in the art and an exemplary configuration will be disclosed further herein.

The outputs of the multiplicative AGC circuits are summed together and are fed to an output transducer 20, which converts the electrical signals into acoustical energy. As will be appreciated by those of ordinary skill in the art, output transducer 20 may be one of a variety of known available hearing-aid earphone transducers, such as a model ED 1932, available from Knowles Electronics of Ithaca, Ill., in conjunction with a calibrating amplifier to ensure the transduction of a specified electrical signal level into the correspondingly specified acoustical signal level. Alternately, transducer 20 may be another earphone-like device or an audio power amplifier and speaker system.

Figure 2:
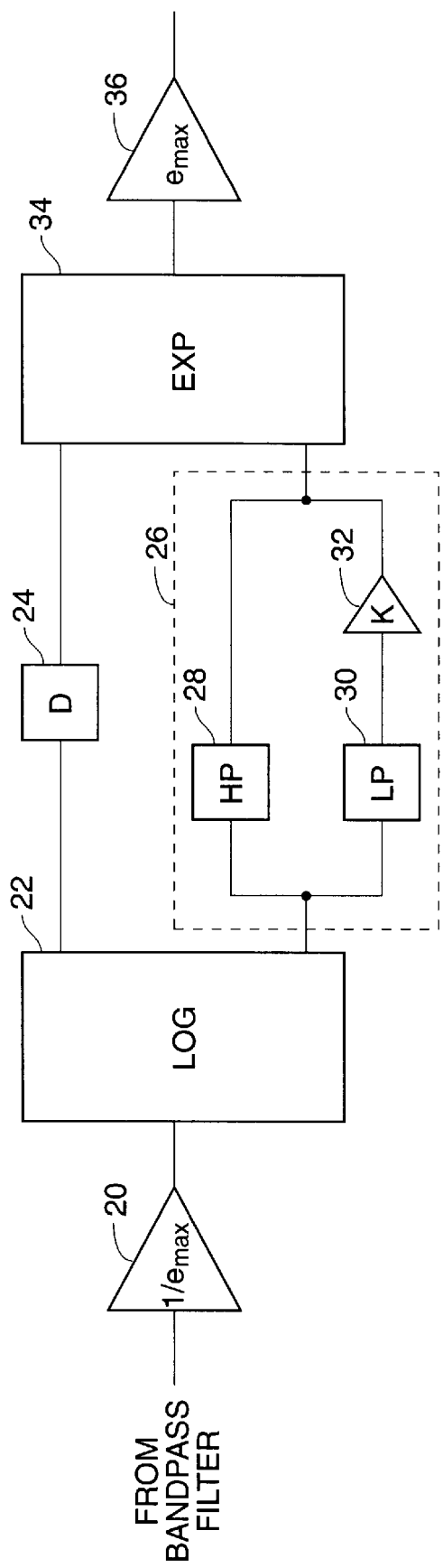
FIG. 2 is a more detailed block diagram of a typical multiplicative AGC circuit according to a presently preferred embodiment of the invention.

Referring now to FIG. 2, a more detailed conceptual block diagram of a typical multiplicative AGC circuit 18 according to a presently preferred embodiment of the invention is shown. As previously noted, multiplicative AGC circuits are known in the art. An illustrative multiplicative AGC circuit which will function in the present invention is disclosed in the article T. Stockham, Jr., *The Application of Generalized Linearity to Automatic Gain Control*, IEEE Transactions on Audio and Electroacoustics, AU-16(2): pp 267–270, June 1968. A similar example of such a multiplicative AGC circuit may be found in U.S. Pat. No. 3,518,578 to Oppenheim et al.

Conceptually, the multiplicative AGC circuit which may be used in the present invention accepts an input signal at amplifier 20 from the output of one of the bandpass filters 16-n. Amplifier 20 is set to have a gain of $1/e_{max}$, where $e_{max}$ is the maximum allowable value of the audio envelope for which AGC gain is applied (i.e., for input levels above $e_{max}$, AGC attenuation results). Within each band segment in the apparatus of the present invention, the quantity $e_{max}$ is the maximum acoustic intensity for which gain is to be applied. This gain level for $e_{max}$ (determined by audiological examination of a patient) often corresponds to the upper comfort level of sound. In an analog implementation of the present invention, amplifier 20 may be a known operational amplifier circuit, and in a DSP implementation, amplifier 20 may be a multiplier function having the input signal as one input term and the constant $1/e_{max}$ as the other input term.

The output of amplifier 20 is processed in the "LOG" block 22 to derive the logarithm of the signal. The LOG block 22 derives a complex logarithm of the input signal, with one output representing the sign of the input signal and the other output representing the logarithm of the absolute value of the input. In an analog implementation of the present invention, LOG block 22 may be, for example, an amplifier having a logarithmic transfer curve, or a circuit such as the one shown in FIGS. 8 and 9 of U.S. Pat. No. 3,518,578. In a DSP implementation, LOG block 22 may be implemented as a software subroutine running on a microprocessor or similar computing engine as is well known in the art, or from other equivalent means such as a look-up table. Examples of such implementations are found in Knuth, Donald E., The Art of Computer Programming, Vol. 1, Fundamental Algorithms, Addison-Wesley Publishing 1968, pp. 21–26 and Abramowitz, M. and Stegun, I. A., Handbook of Mathematical Functions, US Department of Commerce, National Bureau of Standards, Appl. Math Series 55, 1968. Those of ordinary skill in the art will recognize that by setting the gain of the amplifier 20 to $1/e_{max}$, the output of amplifier 20 (when the input is less than $e_{max}$) will never be greater than one and the logarithm term out of LOG block 22 will always be 0 or less.

Figure 3:
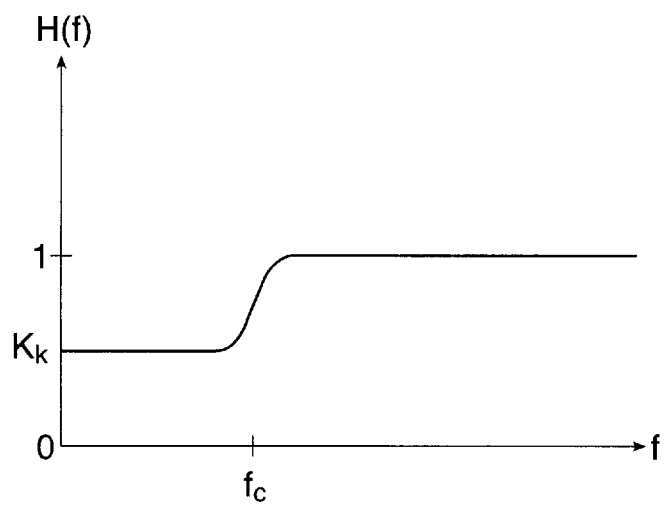
FIG. 3 is a plot of the response characteristics of the filter employed in the multiplicative AGC circuit of FIG. 2.

The first output of LOG block 22 containing the sign information of its input signal is presented to a Delay block 24, and a second output of LOG block 22 representing the logarithm of the absolute value of the input signal is presented to a filter 26 having a characteristic preferably like that shown in FIG. 3. Conceptually, filter 26 may comprise both high-pass filter 28 and low-pass filter 30 followed by amplifier 32 having a gain equal to K. As will be appreciated by those of ordinary skill in the art, high-pass filter 28 may be synthesized by subtracting the output of the low-pass filter from the input of the low-pass filter.

Both high-pass filter 28 and low-pass filter 30 have a cutoff frequency that is determined by the specific application. In a hearing compensation system application, a nominal cutoff frequency is about 16 Hz, however, other cutoff frequencies may be chosen for low-pass filter 30 up to about ⅛ of the critical bandwidth associated with the frequency band being processed without deviating from the concepts of this invention. Those of ordinary skill in the art will recognize that filters having response curves other than that shown in FIG. 3 may be used in the present invention. For example, other non-voice applications of the present invention may require a cutoff frequency higher or lower than 16 Hz. As a further example, implementation of a cutoff frequency for low-pass filter 30 equal to ⅛ of the critical bandwidth associated with the frequency channel being processed (i.e., 16-1 through 16-n in FIG. 1) provides for more rapid adaptation to transient acoustic inputs such as a gunshot, hammer blow or automobile backfire.

The sign output of the LOG block 22 which feeds delay 24 has a value of either 1 or 0 and is used to keep track of the sign of the input signal to LOG block 22. The delay 24 is such that the sign of the input signal is fed to the EXP block 34 at the same time as the data representing the absolute value of the magnitude of the input signal, resulting in the proper sign at the output. In the case of a digital embodiment of the present invention, the delay will be null. In the case of an analog embodiment, the delay is made equal to the delay of the high-pass filter 28.

Those of ordinary skill in the art will recognize that many designs exist for amplifiers and for both passive and active analog filters as well as for DSP filter implementations, and that the design for the filters described herein may be elected from among these available designs. For example, in an analog implementation of the present invention, high-pass filter 28 and low-pass filter 30 may be conventional high-pass and low-pass filters of known designs, such as examples found in Van Valkenburg, M. E., Analog Filter Design, Holt, Rinehart and Winston, 1982, pp 58–59. Amplifier 32 may be a conventional operational amplifier. In a digital implementation of the present invention, amplifier 32 may be a multiplier function having the input signal as one input term and the constant K as the other input term. DSP filter techniques are well understood by those of ordinary skill in the art.

The outputs of high-pass filter 28 and amplifier 32 are combined and presented to the input of EXP block 34 along with the unmodified output of LOG block 22. EXP block 34 processes the signal to provide an exponential function. In an analog implementation of the present invention, EXP block 34 may be an amplifier with an exponential transfer curve. Examples of such circuits are found in FIGS. 8 and 9 of U.S. Pat. No. 3,518,578. In a DSP implementation EXP block 34 may be implemented as a software subroutine as is well known in the art, or from other equivalent means such as a look-up table. Examples of known implementations of this function are found in the Knuth and Abramowitz et al. references, and U.S. Pat. No. 3,518,578, previously cited.

Sound may be conceptualized as the product of two components. The first is the always positive slowly varying envelope and may be written as e(t), and the second is the rapidly varying carrier which may be written as v(t). The total sound may be expressed as:

$$s(t)=e(t) \cdot v(t)$$

Since an audio waveform is not always positive (i.e., v(t) is negative about half of the time), its logarithm at the output of LOG block 22 will have a real part and an imaginary part. If LOG block 22 is configured to process the absolute value of s(t), its output will be the sum of log $(e(t)/e_{max})$ and log |v(t)|. Since log |v(t)| contains high frequencies, it will pass through high-pass filter 28 essentially unaffected. The component log $(e(t)/e_{max})$ contains low frequency components and will be passed by low-pass filter 30 and emerge from amplifier 32 as K log $(e(t)/e_{max})$. The output of EXP block 34 will therefore be:

$$(e(t)/emax)^{K} \cdot v(t)$$

When K<1, it may be seen that the processing in the multiplicative AGC circuit of FIG. 2 performs a compression function. Persons of ordinary skill in the art will recognize that embodiments of the present invention using these values of K are useful for applications other than hearing compensation.

According to a presently preferred embodiment of the invention employed as a hearing compensation system, K may be about between zero and 1. The number K will be different for each frequency band for each hearing impaired person and may be defined as follows:

$$K=[1-(HL/(UCL-NHT)]$$

where HL is the hearing loss at threshold (in dB), UCL is the upper comfort level (in dB), and NHT is the normal hearing threshold (in dB). Thus, the apparatus of the present invention may be customized to suit the individual hearing impairment of the wearer as determined by examination. The multiplicative AGC circuit in the present invention provides no gain for signal intensities at the upper sound comfort level and a gain equivalent to the hearing loss for signal intensities associated with the normal hearing threshold.

The output of EXP block 32 is fed into amplifier 36 with a gain of $e_{max}$ in order to rescale the signal to properly correspond to the input levels which were previously scaled by $1/e_{max}$ in amplifier 20. Amplifiers 20 and 36 are similarly configured except that their gains differ as just explained.

When K>1, the AGC circuit becomes an expander. Useful applications of such a circuit include noise reduction by expanding a desired signal.

Those of ordinary skill in the art will recognize that when K is negative (in a typical useful range of about zero to −1), soft sounds will become loud and loud sounds will become soft. Useful applications of the present invention in this mode include systems for improving the intelligibility of a low volume audio signal on the same signal line with a louder signal.

Despite the fact that multiplicative AGC has been available in the literature since 1968, and has been mentioned as a candidate for hearing aid circuits, it has been largely ignored by the hearing aid literature. Researchers have agreed, however, that some type of frequency dependent gain is necessary. Yet even this agreement is clouded by perceptions that a bank of filters with AGC will destroy speech intelligibility if more than a few bands are used, see, e.g., R. Plomp, The Negative Effect of Amplitude Compression in Hearing Aids in the Light of the Modulation-Transfer Function, Journal of the Acoustical Society of America, 83, 6, June 1983, pp. 2322–2327. The understanding that a separately configured multiplicative AGC for a plurality of sub-bands across the audio spectrum may be used according to the present invention is a substantial advance in the art.

Figure 4:
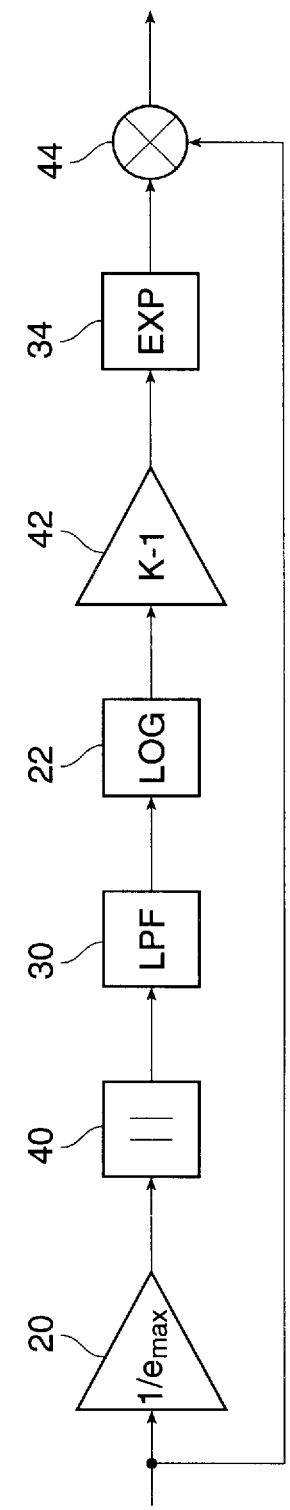
FIG. 4 is a block diagram of an alternate embodiment of the multiplicative AGC circuit of the present invention wherein the log function follows the low-pass filter function.

Referring now to FIG. 4, a block diagram is presented of an alternate embodiment of the multiplicative AGC circuit of the present invention wherein the log function follows the low-pass filter function. Those of ordinary skill in the art will appreciate that the individual blocks of the circuit of FIG. 4 which have the same functions as corresponding blocks of the circuit of FIG. 2 may be configured from the same elements as the corresponding ones of the blocks of FIG. 2.

Like the multiplicative AGC circuit of FIG. 2, the multiplicative AGC circuit of FIG. 4 accepts an input signal at amplifier 20 from the output of one of the bandpass filters 16-n. Amplifier 20 is set to have a gain of $1/e_{max}$, where $e_{max}$ is the maximum allowable value of the audio envelope for which AGC gain is to be applied.

The output of amplifier 20 is passed to absolute value circuit 40. In an analog implementation, there are numerous known ways to implement absolute value circuit 40, such as given, for example, in A. S. Sedra and K. C. Smith, Microelectronic Circuits, Holt, Rinehart and Winston Publishing Co., 2nd ed. 1987. In a digital implementation, this is accomplished by taking the magnitude of the digital number.

The output of absolute value circuit 40 is passed to low-pass filter 30. Low-pass filter 30 may be configured in the same manner as disclosed with reference to FIG. 2. Those of ordinary skill in the art will recognize that the combination of the absolute value circuit 40 and the low-pass filter 30 provide an estimate of the envelope e(t) and hence is known as an envelope detector. Several implementations of envelope detectors are well known in the art and may be used without departing from the teachings of the invention. In a presently preferred embodiment, the output of low-pass filter 30 is processed in the "LOG" block 22 to derive the logarithm of the signal. The input to the log block 22 is always positive due to the action of absolute value block 40, hence no phase or sign term from the log block 22 is used. Again, because the gain of the amplifier 20 is set to $1/e_{max}$, the output of amplifier 20 for inputs less than $e_{max}$ will never be greater than one and the logarithm term out of LOG block 22 will always be 0 or less.

The logarithmic output signal of LOG block 22 is presented to an amplifier 42 having a gain equal to K−1. Other than its gain being different from amplifier 32 of FIG. 2, amplifiers 32 and 42 may be similarly configured. The output of amplifier 42 is presented to the input of EXP block 34 which processes the signal to provide an exponential (anti-log) function.

The output of EXP block 34 is combined with the input to amplifier 20 in multiplier 44. There are a number of known ways to implement multiplier 44. In a digital implementation, this is simply a multiplication. In an analog implementation, an analog multiplier such as shown in A. S. Sedra and K. C. Smith, Microelectronic Circuits, Holt, Rinehart and Winston Publishing Co., 3rd ed. 1991 (see especially page 900) is required.

While the two multiplicative AGC circuits shown in FIGS. 2 and 4 are implemented differently, it has been determined that the output resulting from either the log-lowpass implementation of FIG. 2 and the output resulting from the lowpass-log implementation of FIG. 4 are substantially equivalent, and the output of one cannot be said to be more desirable than the other. In fact, it is thought that the outputs are sufficiently similar to consider the output of either a good representation for both. Listening results of tests performed for speech data to determine if the equivalency of the log-lowpass and the lowpass-log was appropriate for the human auditory multiplicative AGC configurations indicate the intelligibility and fidelity in both configurations was nearly indistinguishable.

Although intelligibility and fidelity is equivalent in both configurations, analysis of the output levels during calibration of the system for specific sinusoidal tones revealed that the lowpass-log maintained calibration while the log-lowpass system deviated slightly from calibration. While either configuration would appear to give equivalent listening results, calibration issues favor the low-pass log implementation of FIG. 4.

The multi-band multiplicative AGC adaptive compression approach of the present invention has no explicit feedback or feedforward. With the addition of a modified soft-limiter to the multiplicative AGC circuit, stable transient response and a low noise floor is ensured. Such an embodiment of a multiplicative AGC circuit for use in the present invention is shown in FIG. 5.

Figure 5:
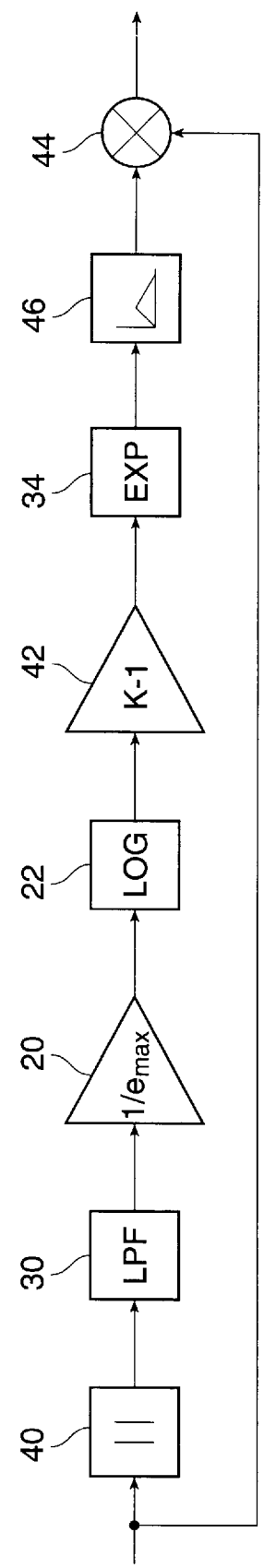
FIG. 5 is a block diagram of an alternate embodiment of the multiplicative AGC circuit of the present invention further including a modified soft-limiter.

The embodiment of FIG. 5 is similar to the embodiment shown in FIG. 4, except that, instead of feeding the absolute value circuit 40, amplifier 20 follows the low-pass filter 30. In addition, a modified soft limiter 46 is interposed between EXP block 34 and multiplier 44. In an analog implementation, soft limiter 46 may be designed, for example, as in A. S. Sedra and K. C. Smith, Microelectronic Circuits, Holt, Rinehart and Winston Publishing Co., 2nd ed. 1987 (see especially pp. 230–239) with the slope in the saturation regions asymptotic to zero. The output of the EXP block 34 is the gain of the system. The insertion of the soft limiter block 46 in the circuit of FIG. 5 limits the gain to the maximum value which is set to be the gain required to compensate for the hearing loss at threshold.

In a digital implementation, soft limiter 46 may be realized as a subroutine which provides an output to multiplier 44 equal to the input to soft limiter 46 for all values of input less than the value of the gain to be realized by multiplier 44 required to compensate for the hearing loss at threshold and provides an output to multiplier 14 equal to the value of the gain required to compensate for the hearing loss at threshold for all inputs greater than this value. Those of ordinary skill in the art will recognize that multiplier 44 functions as a variable gain amplifier whose gain is set by the output of soft limiter 46. It is further convenient, but not necessary to modify the soft limiter to limit the gain for soft sounds below threshold to be equal to or less than that required for hearing compensation at threshold. If the soft limiter 46 is so modified, then care must be taken to ensure that the gain below the threshold of hearing is not discontinuous with respect to a small change in input level.

The embodiments of FIGS. 2 and 4 correctly map acoustic stimulus intensities within the normal hearing range into an equivalent perception level for the hearing impaired, but they also provide increasing gain when the input stimulus intensity is below threshold. The increasing gain for sounds below threshold has the effect of introducing annoying noise artifacts into the system, thereby increasing the noise floor of the output. Use of the embodiment of FIG. 5 with the modified soft limiter in the processing stream eliminates this additional noise. Use of the modified soft limiter provides another beneficial effect by eliminating transient overshoot in the system response to an acoustic stimulus which rapidly makes the transition from silence to and uncomfortably loud intensity.

The stabilization effect of the soft limiter may also be achieved by introducing appropriate delay into the system, but this can have damaging side effects. Delayed speech transmission to the ear of one's own voice causes a feedback delay which can induce stuttering. Use of the modified soft limiter eliminates the acoustic delay used by other techniques and simultaneously provides stability and an enhanced signal-to-noise ratio.

An alternate method for achieving stability is to add a low level (i.e., an intensity below the hearing threshold level) of noise to the inputs to the bandpass filters 16-1 through 16-n. This noise should be weighted such that its spectral shape follows the threshold-of-hearing curve for a normal hearing individual as a function of frequency. This is shown schematically by the noise generator 48 in FIG. 1. Noise generator 48 is shown injecting a low level of noise into each of bandpass filters 16-1 through 16-n. Numerous circuits and methods for noise generation are well known in the art.

In the embodiments of FIGS. 4 and 5, the subcircuit comprising absolute value circuit 40 followed by low-pass filter 30 functions as an envelope detector. The absolute value circuit may function as a half-wave rectifier, a full-wave rectifier, or a circuit whose output is the RMS value of the input with an appropriate scaling adjustment. Because the output of this envelope detector subcircuit has a relatively low bandwidth, the envelope updates in digital realizations of this circuit need only be performed at the Nyquist rate for the envelope bandwidth, a rate less than 500 Hz. Those of ordinary skill in the art will appreciate that this will enable low power digital implementations.

The multiplicative AGC full range adaptive compression for hearing compensation differs from the earlier FFT work in several significant ways. The multi-band multiplicative AGC adaptive compression technique of the present invention does not employ frequency domain processing but instead uses time domain filters with similar or equivalent Q based upon the required critical bandwidth. In addition, in contrast to the FFT approach, the system of the present invention employing multiplicative AGC adaptive compression may be implemented with a minimum of delay and no explicit feedforward or feedback.

In the prior art FFT implementation, the parameter to be measured using this prior art technique was identified in the phon space. The presently preferred system of the present invention incorporating multi-band multiplicative AGC adaptive compression inherently includes recruitment phenomenalogically, and requires only the measure of threshold hearing loss and upper comfort level as a function of frequency.

Finally, the multi-band multiplicative AGC adaptive compression technique of the present invention utilizes a modified soft limiter 46 or alternatively a low level noise generator 48 which eliminates the additive noise artifact introduced by prior-art processing and maintains sound fidelity. However, more importantly, the prior-art FFT approach will become unstable during the transition from silence to loud sounds if an appropriate time delay is not used. The presently preferred multiplicative AGC embodiment of the present invention is stable without the use of this delay.

The multi-band, multiplicative AGC adaptive compression approach of the present invention has several advantages. First, only the threshold and upper comfort levels for the person being fitted need to be measured. The same lowpass filter design is used to extract the envelope, e(t), of the sound stimulus s(t), or equivalently the log (e(t)), for each of the frequency bands being processed. Further, by using this same filter design and simply changing the cutoff frequencies of the low-pass filters as previously explained, other applications may be accommodated including those where rapid transition from silence to loud sounds is anticipated.

The multi-band, multiplicative AGC adaptive compression approach of the present invention has a minimum time delay. This eliminates the auditory confusion which results when an individual speaks and hears their own voice as a direct path response to the brain and receives a processed delayed echo through the hearing aid system.

Normalization with the factor $e_{max}$, makes it mathematically impossible for the hearing aid to provide a gain which raises the output level above a predetermined upper comfort level, thereby protecting the ear against damage. For sound input levels greater than $e_{max}$ the device attenuates sound rather than amplifying it. Those of ordinary skill in the art will recognize that further ear protection may be obtained by limiting the output to a maximum safe level without departing from the concepts herein.

A separate exponential constant K is used for each frequency band which provides precisely the correct gain for all input intensity levels, hence, no switching between linear and compression ranges occurs. Switching artifacts are eliminated.

The multi-band, multiplicative AGC adaptive compression approach of the present invention has no explicit feedback or feedforward. With the addition of a modified soft-limiter, stable transient response and a low noise floor is ensured. A significant additional benefit over the prior art which accrues to the present invention as a result of the minimum delay and lack of explicit feedforward or feedback in the multiplicative AGC is the amelioration of annoying audio feedback or regeneration typical of hearing aids which have both the hearing aid microphone and speaker within close proximity to the ear.

The multiplicative AGC may be implemented with either digital or analog circuitry due to its simplicity. Low power implementation is possible. As previously noted, in digital realizations, the envelope updates (i.e., the operations indicated by LOG block 22, amplifier 42, and EXP block 34 in the embodiment of FIG. 4 and amplifier 20, LOG block 22, amplifier 42 and EXP block 34 in the embodiment of FIG. 5) need only be performed at the Nyquist rate for the envelope bandwidth, a rate less than 500 Hz, thereby significantly reducing power requirements.

The multi-band, multiplicative AGC adaptive compression system of the present invention is also applicable to other audio problems. For example, sound equalizers typically used in stereo systems and automobile audio suites can take advantage of the multi-band multiplicative AGC approach since the only user adjustment is the desired threshold gain in each frequency band. This is equivalent in adjustment procedure to current graphic equalizers, but the AGC provides a desired frequency boost without incurring abnormal loudness growth as occurs with current systems.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A hearing compensation system comprising:

an input transducer for converting acoustical information at an input thereof to electrical signals at an output thereof, said electrical signals being a multiplication of a vibratory component of said acoustical information and an envelope of said vibratory component of said acoustical information;

an output transducer for converting electrical signals at an input thereof to acoustical information at an output thereof;

a plurality of bandpass filters, each bandpass filter having an input connected to said output of said input transducer and an output;

a plurality of multiplicative AGC circuits, each multiplicative AGC circuit of said plurality of AGC circuits having an input and an output, said input of each multiplicative AGC circuit connected to said output of an associated bandpass filter; each of said plurality of multiplicative AGC circuits applying AGC to said envelope of said vibratory component from said associated bandpass filter and multiplying thereby with said vibratory component from said associated bandpasss filter, and all outputs of said plurality of multiplicative AGC circuits summed to form a summed output, said summed output connected to the input of said output transducer; and wherein each of said multiplicative AGC circuits comprises:

a first amplifier element having an input and an output, said first amplifier element having a having a gain of $1/e_{max}$, where $e_{max}$ is the maximum value of an audio envelope to be presented to said AGC circuit for which AGC amplification is to result;

a logarithmic element having an input connected to said output of said first amplifier element, said logarithmic element having a first output carrying a signal indicating the sign of a signal at said input of said logarithmic element and a second output carrying a signal proportional to the logarithm of the absolute value of said signal at said input of said logarithmic element;

a filter having an input connected to said second output of said logarithmic element and an output, said filter having a throughput delay;

a delay element having an input connected to said first output of said logarithmic element and an output, said delay element having a delay equal to said throughput delay;

an exponential element having a first input connected to said output of said delay element a second input connected to said output of said filter element, and an output; and a second amplifier element having an input and an output, said input connected to said output of said exponential element, said second amplifier having a gain of $e_{max}$.

2. A hearing compensation system comprising;

an input transducer for converting acoustical information at an input thereof to electrical signals at an output thereof, said electrical signals being a multiplication of a vibratory component of said acoustical information and an envelope of said vibratory component of said acoustical information;

an output transducer for converting electrical signals at an input thereof to acoustical information at an output thereof;

a plurality of bandpass filters, each bandpass filter having an input connected to said output of said input transducer and an output;

a plurality of multiplicative AGC circuits, each multiplicative AGC circuit of said plurality of AGC circuits having an input and an output, said input of each multiplicative AGC circuit connected to said output of an associated bandpass filter; each of said plurality of multiplicative AGC circuits applying AGC to said envelope of said vibratory component from said associated bandpass filter and multiplying thereby with said vibratory component from said associated bandpasss filter, and all outputs of said plurality of multiplicative AGC circuits summed to form a summed output, said summed output connected to the input of said output transducer; and wherein each of said multiplicative AGC circuits comprises:

a first amplifier element having an input and an output, said input connected to an input node of its AGC circuit, said first amplifier element having a gain of $1/e_{max}$, where $e_{max}$ is the maximum value of an audio envelope to be presented to said AGC circuit for which AGC amplification is to result;

an envelope detector element having an absolute value element having an input and an output, said input of said absolute value element connected to said output of said first amplifier element, and a low-pass filter element having an input and an output, said input of said low-pass filter element connected to said output of said absolute value element;

a logarithmic element having an input connected to said output of said low-pass filter element, said logarithmic element having an output carrying a signal proportional to the logarithm of the value of said signal at said input of said logarithmic element;

a second amplifier element having an input and an output, said input connected to said output of said logarithmic element, said second amplifier having a gain of $k-1$ where k is a number between zero and one;

an exponential element having an input and an output, said input of said exponential element connected to said output of said second amplifier element; and a multiplier element having a first input connected to said output of said exponential element, a second input connected to said input node, and an output connected to an output node of its AGC circuit.

3. A hearing compensation system comprising:

an input transducer for converting acoustical information at an input thereof to electrical signals at an output thereof, said electrical signals being a multiplication of a vibratory component of said acoustical information and an envelope of said vibratory component of said acoustical information;

an output transducer for converting electrical signals at an input thereof to acoustical information at an output thereof;

a plurality of bandpass filters, each bandpass filter having an input connected to said output of said input transducer and an output;

a plurality of multiplicative AGC circuits, each multiplicative AGC circuit of said plurality of AGC circuits having an input and an output, said input of each multiplicative AGC circuit connected to said output of an associated bandpass filter; each of said plurality of multiplicative AGC circuits applying AGC to said envelope of said vibratory component from said associated bandpass filter and multiplying thereby with said vibratory component from said associated bandpasss filter, and all outputs of said plurality of multiplicative AGC circuits summed to form a summed output, said summed output connected to the input of said output transducer; and wherein each of said multiplicative AGC circuits comprises:

an envelope detector element having an absolute value element having an input and an output, said input of said absolute value element connected to an input node of its AGC circuit, and a low-pass filter element having an input and an output, said input of said low-pass filter element connected to said output of said absolute value element;

a first amplifier element having an input and an output, said input of said first amplifier element connected to said output of said low-pass filter element;

a logarithmic element having an input connected to said output of said first amplifier element;

a second amplifier element having an input and an output, said input of said second amplifier connected to said output of said logarithmic element, said second amplifier having a gain of k−1 where k is a number between zero and one;

an exponential element having an input and an output, said input of said exponential element connected to said output of said second amplifier element;

a soft limiter element having an input connected to said output of said exponential element and an output; and a multiplier element having a first input connected to said output of said soft limiter element, a second input connected to said input node, and an output connected to an output node of its AGC circuit.

4. A hearing compensation system comprising:

an input transducer for converting acoustical information at an input thereof to electrical signals at an output thereof, said electrical signals being a multiplication of a vibratory component of said acoustical information and an envelope of said vibratory component of said acoustical information;

an output transducer for converting electrical signals at an input thereof to acoustical information at an output thereof;

a plurality of bandpass filters, each bandpass filter having an input connected to said output of said input transducer and an output;

a plurality of multiplicative AGC circuits, each multiplicative AGC circuit of said plurality of AGC circuits having an input and an output, said input of each multiplicative AGC circuit connected to said output of an associated bandpass filter; each of said plurality of multiplicative AGC circuits applying AGC to said envelope of said vibratory component from said associated bandpass filter and multiplying thereby with said vibratory component from said associated bandpasss filter, and all outputs of said plurality of multiplicative AGC circuits summed to form a summed output, said summed output connected to the input of said output transducer;

wherein each of said multiplicative AGC circuits comprises:

an envelope detector element having an input and an output, said input of said envelope detector element connected to an input node of its AGC circuit;

a first amplifier element having an input and an output, said input of said first amplifier element connected to said output of said envelope detector element;

a logarithmic element having an input connected to said output of said first amplifier element;

a second amplifier element having an input and an output, said input of said second amplifier connected to said output of said logarithmic element, said second amplifier having a gain of k−1 where k is a number between zero and one;

an exponential element having an input and an output, said input of said exponential element connected to said output of said second amplifier element;

a soft limiter element having an input connected to said output of said exponential element and an output; and a multiplier element having a first input connected to said output of said soft limiter element, a second input connected to said input node, and an output connected to an output node of its AGC circuit; and wherein k in said first and second amplifiers is equal to 1 minus the ratio of the hearing loss in dB at threshold in a band of frequencies passed by the one of said bandpass filters with which the individual AGC circuit containing said amplifier is associated to a quantity equal to the upper comfort level in dB within said band of frequencies minus the normal hearing threshold in dB within said band of frequencies.

5. A sound discriminator system comprising:

an input transducer for converting acoustical information at an input thereof to electrical signals at an output thereof;

an output transducer for converting electrical signals at an input thereof to acoustical information at an output thereof;

a plurality of bandpass filters, each bandpass filter having an input connected to said output of said input transducer;

a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to the input of said output transducer, each multiplicative AGC circuit comprising a first amplifier element having an input and an output, said input of said first amplifier element connected to an input node of its multiplicative AGC circuit, an envelope detector element having an input connected to said output of said first amplifier element and an output, a logarithmic element having an input connected to said output of said envelope detector element, a second amplifier element having an input and an output, said input of said second amplifier element connected to said output of said logarithmic element, said second amplifier having a gain of k−1 where k is a number greater than one, an exponential element having an input and an output, said input of said exponential element connected to said output of said second amplifier element, and a multiplier element having a first input connected to said output of said exponential element, a second input connected to said input node, and an output connected to an output node of its multiplicative AGC circuit.

6. The sound discriminator system of claim 5 wherein said envelope detector element comprises:

an absolute value element having an input and an output, said input of said absolute value element connected to said output of said first amplifier element; and a low-pass filter element having an input and an output, said input of said low-pass filter element connected to said output of said absolute value element.

7. A sound discriminator system comprising:

an input transducer for converting acoustical information at an input thereof to electrical signals at an output thereof;

an output transducer for converting electrical signals at an input thereof to acoustical information at an output thereof;

a plurality of bandpass filters, each bandpass filter having an input connected to said output of said input transducer;

a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to the input of said output transducer, each multiplicative AGC circuit comprising an envelope detector element having an input and an output, said input of said envelope detector element connected to an input node of its multiplicative AGC circuit, a first amplifier element having an input and an output, said input of said first amplifier connected to said output of said envelope detector element, a logarithmic element having an input connected to said output of said first amplifier element, a second amplifier element having an input and an output, said input of said second amplifier element connected to said output of said logarithmic element, said second amplifier having a gain of k−1 where k is a number greater than one, an exponential element having an input and an output, said input of said exponential element connected to said output of said second amplifier element, a soft limiter element having an input connected to said output of said exponential element and an output, and a multiplier element having a first input connected to said output of said soft limiter element, a second input connected to said input node, and an output connected to an output node of its multiplicative AGC circuit.

8. The sound discriminator system of claim 7 wherein said envelope detector element comprises:
an absolute value element having an input and an output, said input of said absolute value element connected to said output of said first amplifier element; and
a low-pass filter element having an input and an output, said input of said low-pass filter element connected to said output of said absolute value element.

9. A sound discriminator system comprising:
an input transducer for converting acoustical information at an input thereof to electrical signals at an output thereof;
an output transducer for converting electrical signals at an input thereof to acoustical information at an output thereof;
a plurality of bandpass filters, each bandpass filter having an input connected to said output of said input transducer;
a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to said input of said output transducer, each multiplicative AGC circuit comprising a first amplifier element having an input and an output, said input of said first amplifier element connected to an input node of its multiplicative AGC circuit, an envelope detector element having an input connected to said output of said first amplifier element and an output, a logarithmic element having an input connected to said output of said envelope detector element, a second amplifier element having an input and an output, said input of said second amplifier element connected to said output of said logarithmic element, said second amplifier having a gain of k−1 where k is a number between zero and −1, an exponential element having an input and an output, said input of said exponential element connected to said output of said second amplifier element, and a multiplier element having a first input connected to said output of said exponential element, a second input connected to said input node, and an output connected to an output node of its multiplicative AGC circuit.

10. The sound discriminator system of claim 9 wherein said envelope detector element comprises:
an absolute value element having an input and an output, said input of said absolute value element connected to said output of said first amplifier element; and
a low-pass filter element having an input and an output, said input of said low-pass filter element connected to said output of said absolute value element.

11. A sound discriminator system comprising:
an input transducer for converting acoustical information at an input thereof to electrical signals at an output thereof;
an output transducer for converting electrical signals at an input thereof to acoustical information at an output thereof;
a plurality of bandpass filters, each bandpass filter having an input connected to said output of said input transducer;
a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to said input of said output transducer, each multiplicative AGC circuit comprising an envelope detector element having an input and an output, said input of said envelope detector connected to an input node of its multiplicative AGC circuit, a first amplifier element having an input and an output, said input of said first amplifier element connected to said output of said envelope detector element, a logarithmic element having an input connected to said output of said first amplifier element, a second amplifier element having an input and an output, said input of said second amplifier element connected to said output of said logarithmic element, said second amplifier having a gain of k−1 where k is a number between zero and −1, an exponential element having an input and an output, said input of said exponential element connected to said output of said second amplifier element, a soft limiter element having an input connected to said output of said exponential element and an output, and a multiplier element having a first input connected to said output of said soft limiter element, a second input connected to said input node, and an output connected to an output node of its multiplicative AGC circuit.

12. The sound discriminator system of claim 11 wherein said envelope detector element comprises:
an absolute value element having an input and an output, said input of said absolute value element connected to said output of said first amplifier element; and
a low-pass filter element having an input and an output, said input of said low-pass filter element connected to said output of said absolute value element.

13. A hearing compensation system comprising:
an input transducer for converting acoustical information at an input thereof to electrical signals at an output thereof, said electrical signals being a multiplication of a vibratory component of said acoustical information and an envelope of said vibratory component of said acoustical information;

an output transducer for converting electrical signals at an input thereof to acoustical information at an output thereof;

a plurality of bandpass filters, each bandpass filter having an input connected to said output of said input transducer and an output;

a plurality of multiplicative AGC circuits, each multiplicative AGC circuit of said plurality of AGC circuits having an input and an output, said input of each multiplicative AGC circuit connected to said output of an associated bandpass filter; each of said plurality of multiplicative AGC circuits applying AGC to said envelope of said vibratory component from said associated bandpass filter and multiplying thereby with said vibratory component from said associated bandpasss filter, and all outputs of said plurality of multiplicative AGC circuits summed to form a summed output, said summed output connected to the input of said output transducer; and a first amplifier element having an input and an output, said input connected to an input node of its AGC circuit;

an envelope detector element having an absolute value element having an input and an output, said input of said absolute value element connected to said output of said first amplifier element, and a low-pass filter element having an input and an output, said input of said low-pass filter element connected to said output of said absolute value element;

a logarithmic element having an input connected to said output of said low-pass filter element;

a second amplifier element having an input and an output, said input connected to said output of said logarithmic element, said second amplifier having a gain of k−1 where k is a number between zero and one;

an exponential element having an input and an output, said input of said exponential element connected to said output of said second amplifier element;

a soft limiter element having an input connected to said output of said exponential element and an output; and a multiplier element having a first input connected to said output of said soft limiter element, a second input connected to said input node, and an output connected to an output node of its AGC circuit.

14. The hearing compensation system of claim 13 wherein said envelope detector element comprises:

an absolute value element having an input and an output, said input of said absolute value element connected to said output of said first amplifier element; and a low-pass filter element having an input and an output, said input of said low-pass filter element connected to said output of said absolute value element.

15. A hearing compensation system comprising:

an input transducer for converting acoustical information at an input thereof to electrical signals at an output thereof, said electrical signals being a multiplication of a vibratory component of said acoustical information and an envelope of said vibratory component of said acoustical information;

an output transducer for converting electrical signals at an input thereof to acoustical information at an output thereof;

a plurality of bandpass filters, each bandpass filter having an input connected to said output of said input transducer and an output;

a plurality of multiplicative AGC circuits, each multiplicative AGC circuit of said plurality of AGC circuits having an input and an output, said input of each multiplicative AGC circuit connected to said output of an associated bandpass filter; each of said plurality of multiplicative AGC circuits applying AGC to said envelope of said vibratory component from said associated bandpass filter and multiplying thereby with said vibratory component from said associated bandpasss filter, and all outputs of said plurality of multiplicative AGC circuits summed to form a summed output, said summed output connected to the input of said output transducer; and an envelope detector element having an absolute value element having an input and an output, said input of said absolute value element connected to an input node of its AGC circuit, and a low-pass filter element having an input and an output, said input of said low-pass filter element connected to said output of said absolute value element;

a first amplifier element having an input and an output, said input of said first amplifier element connected to said low-pass filter element;

a logarithmic element having an input connected to said output of said first amplifier element;

a second amplifier element having an input and an output, said input of said second amplifier connected to said output of said logarithmic element, said second amplifier having a gain of k−1 where k is a number between zero and one;

an exponential element having an input and an output, said input of said exponential element connected to said output of said second amplifier element; and a multiplier element having a first input connected to said output of said exponential element, a second input connected to said input node, and an output connected to an output node of its AGC circuit.

16. The hearing compensation system of claim 15 wherein said envelope detector element comprises:

an absolute value element having an input and an output, said input of said absolute value element connected to said input node; and a low-pass filter element having an input and an output, said input of said low-pass filter element connected to said output of said absolute value element.

17. A sound discriminator system comprising:

an input transducer for converting acoustical information at an input thereof to electrical signals at an output thereof;

an output transducer for converting electrical signals at an input thereof to acoustical information at an output thereof;

a plurality of bandpass filters, each bandpass filter having an input connected to said output of said input transducer;

a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to the input of said output transducer, each multiplicative AGC circuit comprising a first amplifier element having an input and an output, said input of said first amplifier element connected to an input node of its multiplicative AGC circuit, an envelope detector element having an input connected to said output of said first amplifier element and an output, a logarithmic element having an input connected to said output of said envelope detector element, a second amplifier element having an input and an output, said input of said second amplifier element connected to said output of said logarithmic element, said second amplifier having a gain of k−1 where k is a number greater than one, an exponential element having an input and an output, said input of said exponential element connected to said output of said second amplifier element, a soft limiter element having an input connected to said output of said exponential element and an output, and a multiplier element having a first input connected to said output of said soft limiter element, a second input connected to said input node, and an output connected to an output node of its multiplicative AGC circuit.

18. The sound discriminator system of claim 17 wherein said envelope detector element comprises:
    an absolute value element having an input and an output, said input of said absolute value element connected to said output of said first amplifier element; and
    a low-pass filter element having an input and an output, said input of said low-pass filter element connected to said output of said absolute value element.

19. A sound discriminator system comprising:
    an input transducer for converting acoustical information at an input thereof to electrical signals at an output thereof;
    an output transducer for converting electrical signals at an input thereof to acoustical information at an output thereof;
    a plurality of bandpass filters, each bandpass filter having an input connected to said output of said input transducer;
    a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to the input of said output transducer, each multiplicative AGC circuit comprising an envelope detector element having an input and an output, said input of said envelope detector element connected to an input node of its multiplicative AGC circuit, a first amplifier element having an input and an output, said input of said first amplifier connected to said output of said envelope detector element, a logarithmic element having an input connected to said output of said first amplifier element, a second amplifier element having an input and an output, said input of said second amplifier element connected to said output of said logarithmic element, said second amplifier having a gain of k−1 where k is a number greater than one, an exponential element having an input and an output, said input of said exponential element connected to said output of said second amplifier element, and a multiplier element having a first input connected to said output of said exponential element, a second input connected to said input node, and an output connected to an output node of its multiplicative AGC circuit.

20. The sound discriminator system of claim 19 wherein said envelope detector element comprises:
    an absolute value element having an input and an output, said input of said absolute value element connected to said output of said first amplifier element; and
    a low-pass filter element having an input and an output, said input of said low-pass filter element connected to said output of said absolute value element.

21. A sound discriminator system comprising:
    an input transducer for converting acoustical information at an input thereof to electrical signals at an output thereof;
    an output transducer for converting electrical signals at an input thereof to acoustical information at an output thereof;
    a plurality of bandpass filters, each bandpass filter having an input connected to said output of said input transducer;
    a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to said input of said output transducer, each multiplicative AGC circuit comprising a first amplifier element having an input and an output, said input of said first amplifier element connected to an input node of its multiplicative AGC circuit, an envelope detector element having an input connected to said output of said first amplifier element and an output, a logarithmic element having an input connected to said output of said envelope detector element, a second amplifier element having an input and an output, said input of said second amplifier element connected to said output of said logarithmic element, said second amplifier having a gain of k−1 where k is a number between zero and −1, an exponential element having an input and an output, said input of said exponential element connected to said output of said second amplifier element, a soft limiter element having an input connected to said output of said exponential element and an output, and a multiplier element having a first input connected to said output of said soft limiter element, a second input connected to said input node, and an output connected to an output node of its multiplicative AGC circuit.

22. The sound discriminator system of claim 21 wherein said envelope detector element comprises:
    an absolute value element having an input and an output, said input of said absolute value element connected to said output of said first amplifier element; and
    a low-pass filter element having an input and an output, said input of said low-pass filter element connected to said output of said absolute value element.

23. A sound discriminator system comprising:
    an input transducer for converting acoustical information at an input thereof to electrical signals at an output thereof;
    an output transducer for converting electrical signals at an input thereof to acoustical information at an output thereof;
    a plurality of bandpass filters, each bandpass filter having an input connected to said output of said input transducer;

a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to said input of said output transducer, each multiplicative AGC circuit comprising an envelope detector element having an input and an output, said input of said envelope detector connected to an input node of its multiplicative AGC circuit, a first amplifier element having an input and an output, said input of said first amplifier element connected to said output of said envelope detector element, a logarithmic element having an input connected to said output of said first amplifier element, a second amplifier element having an input and an output, said input of said second amplifier element connected to said output of said logarithmic element, said second amplifier having a gain of k−1 where k is a number between zero and −1, an exponential element having an input and an output, said input of said exponential element connected to said output of said second amplifier element, and a multiplier element having a first input connected to said output of said exponential element, a second input connected to said input node, and an output connected to an output node of its multiplicative AGC circuit.

24. The sound discriminator system of claim 23 wherein said envelope detector element comprises:

an absolute value element having an input and an output, said input of said absolute value element connected to said output of said first amplifier element; and a low-pass filter element having an input and an output, said input of said low-pass filter element connected to said output of said absolute value element.

25. A hearing compensation system comprising:

an input transducer for converting acoustical information at an input thereof to electrical signals at an output thereof;

an output transducer for converting electrical signals at an input thereof to acoustical information at an output thereof;

a plurality of bandpass filters, each bandpass filter having an input connected to said output of said input transducer;

a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to the input of said output transducer, wherein each of said multiplicative AGC circuits comprises a first amplifier element having an input and an output, said input of said first amplifier element forming the input node of its multiplicative AGC circuit, an envelope detector element having an input connected to said output of said first amplifier element, a cutoff frequency and an output, a logarithmic element having an input connected to said output of said envelope detector element, a second amplifier element having an input and an output, said input of said second amplifier element connected to said output of said logarithmic element, said second amplifier having a gain of k−1 where k is a number between zero and one, an exponential element having an input and an output, said input of said exponential element connected to said output of said second amplifier element, a soft limiter element having an input connected to said output of said exponential element and an output, and a multiplier element having a first input connected to said output of said soft limiter element, a second input connected to said input node of said multiplicative AGC circuit, and an output forming the output node of its multiplicative AGC circuit.

26. The hearing compensation system of claim 25 wherein said envelope detector element comprises:

an absolute value element having an input and an output, said input forming the input of said envelope detector element; and a low-pass filter element having an input, and an output forming the output of said envelope detector element, said input of said low-pass filter element connected to said output of said absolute value element.

27. The hearing compensation system of claim 26 wherein said low-pass filter element has a cutoff frequency which is a monotonic function of the center frequency of said bandpass filter associated with said multiplicative AGC circuit.

28. A hearing compensation system comprising:

an input transducer for converting acoustical information at an input thereof to electrical signals at an output thereof;

an output transducer for converting electrical signals at an input thereof to acoustical information at an output thereof;

a plurality of bandpass filters, each bandpass filter having an input connected to said output of said input transducer;

a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to the input of said output transducer, wherein each of said multiplicative AGC circuits comprises an envelope detector element having an input forming the input node of its multiplicative AGC circuit, a cutoff frequency and an output, said cutoff frequency being a monotonic function of the center frequency of said bandpass filter associated with said multiplicative AGC circuit, a first amplifier element having an input, said input of said first amplifier element connected to said output of said envelope detector element, a logarithmic element having an input connected to said output of said first amplifier element, a second amplifier element having an input and an output, said input of said second amplifier element connected to said output of said logarithmic element, said second amplifier having a gain of k−1 where k is a number between zero and one, an exponential element having an input and an output, said input of said exponential element connected to said output of said second amplifier element, a soft limiter element having an input connected to said output of said second amplifier element and an output, and a multiplier element having a first input connected to said output of said soft limiter element, a second input connected to said input node of said multiplicative AGC circuit, and an output forming the output node of its multiplicative AGC circuit.

29. The hearing compensation system of claim 28 wherein said envelope detector element comprises:
- an absolute value element having an input and an output, said input forming the input of said envelope detector element; and
- a low-pass filter element implementing said cutoff frequency, said low-pass filter element having an input and an output forming the output of said envelope detector element, said input of said low-pass filter element connected to said output of said absolute value element.

30. A hearing compensation system comprising:
- an input transducer for converting acoustical information at an input thereof to electrical signals at an output thereof;
- an output transducer for converting electrical signals at an input thereof to acoustical information at an output thereof;
- a plurality of bandpass filters, each bandpass filter having an input connected to said output of said input transducer;
- a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to the input of said output transducer, wherein each of said multiplicative AGC circuits comprises an envelope detector element having an input forming the input node of its multiplicative AGC circuit, a cutoff frequency and an output, a first amplifier element having an input, said input of said first amplifier element connected to said output of said envelope detector element, a logarithmic element having an input connected to said output of said first amplifier element, a second amplifier element having an input and an output, said input of said second amplifier element connected to said output of said logarithmic element, said second amplifier having a gain of k−1 where k is a number between zero and one, an exponential element having an input and an output, said input of said exponential element connected to said output of said second amplifier element, and a multiplier element having a first input connected to said output of said exponential element, a second input connected to said input node of said multiplicative AGC circuit, and an output forming the output node of its multiplicative AGC circuit.

31. The hearing compensation system of claim 30 wherein said envelope detector element comprises:
- an absolute value element having an input and an output, said input forming the input of said envelope detector element; and
- a low-pass filter element implementing said cutoff frequency, said low-pass filter element having an input and an output forming the output of said envelope detector element, said input of said low-pass filter element connected to said output of said absolute value element.

32. A sound discriminator system comprising:
- an input transducer for converting acoustical information at an input thereof to electrical signals at an output thereof;
- an output transducer for converting electrical signals at an input thereof to acoustical information at an output thereof;
- a plurality of bandpass filters, each bandpass filter having an input connected to said output of said input transducer and an output;
- a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to the input of said output transducer, each multiplicative AGC circuit comprising a first amplifier element having an input and an output, said input of said first amplifier element forming the input node of its multiplicative AGC circuit, an envelope detector element having an input connected to said output of said first amplifier element, a cutoff frequency, and an output, a logarithmic element having an input connected to said output of said envelope detector element, a second amplifier element having an input and an output, said input of said second amplifier element connected to said output of said logarithmic element, said second amplifier having a gain of k−1 where k is a number greater than one, an exponential element having an input and an output, said input connected to said output of said second amplifier element, a soft limiter element having an input connected to said output of said exponential element and an output, and a multiplier element having a first input connected to said output of said soft limiter element, a second input connected to said input node of said multiplicative AGC circuit, and an output forming the output node of its multiplicative AGC circuit.

33. The sound discriminator system of claim 32 wherein said envelope detector element comprises:
- an absolute value element having an input and an output, said input forming the input of said envelope detector element; and
- a low-pass filter element implementing said cutoff frequency, said low-pass filter element having an input and an output forming the output of said envelope detector element, said input of said low-pass filter element connected to said output of said absolute value element.

34. A sound discriminator system comprising:
- an input transducer for converting acoustical information at an input thereof to electrical signals at an output thereof;
- an output transducer for converting electrical signals at an input thereof to acoustical information at an output thereof;
- a plurality of bandpass filters, each bandpass filter having an input connected to said output of said input transducer;
- a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to the input of said output transducer, each multiplicative AGC circuit comprising an envelope detector element having an input forming the input node of its multiplicative AGC circuit, a cutoff frequency and an output, a first amplifier element having an input, said input of said first amplifier element connected to said output of said envelope detector element, a logarithmic element having an input connected to said output of said first amplifier element, a second amplifier element having an input and an output, said input of said second amplifier element connected to said output of said logarithmic element, said second amplifier having a gain of k−1 where k is a number greater than one, an exponential element having an input and an output, said input of said exponential element connected to said output of said second amplifier element, a soft limiter element having an input connected to said output of said second amplifier element and an output, and a multiplier element having a first input connected to said output of said soft limiter element, a second input connected to said input node of said multiplicative AGC circuit, and an output forming the output node of its multiplicative AGC circuit.

35. The sound discriminator system of claim 34 wherein said envelope detector element comprises:

an absolute value element having an input and an output, said input forming the input of said envelope detector element; and a low-pass filter element implementing said cutoff frequency, said low-pass filter element having an input and an output forming the output of said envelope detector element, said input of said low-pass filter connected to said output of said absolute value element.

36. A sound discriminator system comprising:

an input transducer for converting acoustical information at an input thereof to electrical signals at an output thereof;

an output transducer for converting electrical signals at an input thereof to acoustical information at an output thereof;

a plurality of bandpass filters, each bandpass filter having an input connected to said output of said input transducer;

a plurality of multiplicative AGC circuits, each individual multiplicative AGC circuit associated with a different one of said bandpass filters and having an input connected to the output of its associated bandpass filter and an output summed with the outputs of all other ones of said multiplicative AGC circuits to form a summed output, said summed output connected to the input of said output transducer, each multiplicative AGC circuit comprising an envelope detector element having an input forming the input node of its multiplicative AGC circuit, a cutoff frequency and an output, a first amplifier element having an input, said input of said first amplifier element connected to said output of said envelope detector element, a logarithmic element having an input connected to said output of said first amplifier element, a second amplifier element having an input and an output, said input of said second amplifier element connected to said output of said logarithmic element, said second amplifier having a gain of k−1 where k is a number greater than one, an exponential element having an input and an output, said input of said exponential element connected to said output of said second amplifier element, and a multiplier element having a first input connected to said output of said exponential element, a second input connected to said input node of said multiplicative AGC circuit, and an output forming the output node of its multiplicative AGC circuit.

37. The sound discriminator system of claim 36 wherein said envelope detector element comprises:

an absolute value element having an input and an output, said input forming the input of said envelope detector element; and a low-pass filter element implementing said cutoff frequency, said low-pass filter element having an input and an output forming the output of said envelope detector element, said input of said low-pass filter connected to said output of said absolute value element.

* * * * *

UNITED STATES PATENT AND TRADEMARK OFFICE
CERTIFICATE OF CORRECTION

PATENT NO. : 5,848,171  Page 1 of 2
DATED : December 8, 1998
INVENTOR(S) : Thomas G. Stockham, Jr., et al It is certified that error appears in the above-identified patent and that said Letters Patent is hereby corrected as shown below:

On the title page, item [22], in the date filed, replace "January 16" with --January 12 --

| | |
|---|---|
| Column 1, line 54: | replace "1860" with --1960--. |
| Column 5, line 13: | replace "invention ," with --invention,--. |
| Column 5, line 24: | after "octave" insert --audio--. |
| Column 5, line 26: | after "particular" insert --audio--. |
| Column 5, line 31: | after "invention" insert --audio--. |
| Column 5, line 38: | after "Gopinath" insert --,--. |
| Column 5, line 44: | after "individual" insert --audio--. |
| Column 5, line 61 | after "Alternatively," insert --output--. |
| Column 6, line 10: | after the second occurrence of "the" insert --audio--. |
| Column 6, line 49: | replace "Delay" with --delay--. |
| Column 6, line 58: | after both occurrences of "filter" insert --30--. |
| Column 8, line 3: | replace "emax" with --$e_{max}$--. |
| Column 8, line 28: | replace "32" with --34--. |
| Column 9, line 1: | after the second occurrence of "the" insert --audio--. |
| Column 9, line 24: | replace "log" with --LOG--. |
| Column 9, line 26: | replace "log" with --LOG--. |
| Column 9, line 60: | replace "is" with --are--. |

UNITED STATES PATENT AND TRADEMARK OFFICE
CERTIFICATE OF CORRECTION

PATENT NO. : 5,848,171
DATED : December 8, 1998
INVENTOR(S) : Thomas G. Stockham, Jr., et al It is certified that error appears in the above-identified patent and that said Letters Patent is hereby corrected as shown below:

Column 10, line 27: replace "14" with --44--.
Column 10, line 33: after "limiter" insert --46--.
Column 10, line 47: after "limiter" insert --46--.
Column 10, line 48: after "limiter" insert --46--.
Column 10, line 53: after "limiter" insert --46--.
Column 10, line 58: after "limiter" insert --46--.
Column 10, line 63: after the second occurrence of "the" insert --audio--.
Column 11, line 1: after the second occurrence of "of" insert --audio--.
Column 11, line 7: after "circuit" insert --40--.
Column 12, line 14: replace "soft-limiter" with --soft limiter--.

Signed and Sealed this

Ninth Day of January, 2001

*Attest:*

Q. TODD DICKINSON

*Attesting Officer*     *Commissioner of Patents and Trademarks*